United States Patent [19]

Raviglione et al.

[11] Patent Number: 4,967,143

[45] Date of Patent: Oct. 30, 1990

[54] SYSTEM FOR DIAGNOSING ANOMALIES OR BREAKDOWNS IN A PLURALITY OF TYPES OF ELECTRONIC CONTROL SYSTEMS INSTALLED IN MOTOR VEHICLES

[75] Inventors: Cesare Raviglione; Paolo Rubino, both of Turin, Italy

[73] Assignee: Fiat Auto S.p.A., Turin, Italy

[21] Appl. No.: 208,360

[22] PCT Filed: Aug. 31, 1987

[86] PCT No.: PCT/EP87/00492

§ 371 Date: May 9, 1988

§ 102(e) Date: May 9, 1988

[87] PCT Pub. No.: WO88/02122

PCT Pub. Date: Mar. 24, 1988

[30] Foreign Application Priority Data

Sep. 9, 1986 [IT] Italy .................. 67696 A/86

[51] Int. Cl.⁵ .................. G01R 31/00; G01R 31/28
[52] U.S. Cl. .................. 324/73.1; 324/158 R; 324/378
[58] Field of Search .................. 324/73 R, 73 AT, 378, 324/379, 402, 73 PC, 158 R, 73.1, ; 364/551.01, 431.01; 73/116

[56] References Cited

U.S. PATENT DOCUMENTS

| 3,039,604 | 6/1962 | Bickel et al. | 324/73 AT |
| 4,150,331 | 4/1979 | Lacher | 324/73 PC |
| 4,211,917 | 7/1980 | Hofmann | 324/73 PC |
| 4,267,569 | 5/1981 | Baumann et al. | 324/379 |
| 4,694,408 | 9/1987 | Zaleski | 364/551.02 |
| 4,757,463 | 7/1988 | Ballou et al. | 364/551.01 |

FOREIGN PATENT DOCUMENTS

| 0072000 | 2/1983 | European Pat. Off. |
| 0231607 | 8/1987 | European Pat. Off. |
| 3505068 | 6/1986 | Fed. Rep. of Germany |
| 3540599 | 5/1987 | Fed. Rep. of Germany |
| 2570040 | 9/1985 | France |
| 0030964 | 2/1982 | Japan | 324/73 PC |
| 0172562 | 10/1983 | Japan | 324/73 PC |

OTHER PUBLICATIONS

Preston et al; "Multiprocessor . . . "; IEE Proc.; vol. 129; Pt. E; No. 6; Nov. 1982; pp. 223–228.

Primary Examiner—Ernest F. Karlsen
Attorney, Agent, or Firm—Sughrue, Mion, Zinn, Macpeak & Seas

[57] ABSTRACT

The system enables the diagnosis of anomalies or breakdowns in a plurality of types of electronic control systems (S), each of which includes, in known manner, a plurality of sensors (2) and electrically-controlled actuators (3) connected to an electronic control and operating unit (1), which is different for each type of control system (S). This unit (1) is programmed to carry out auto-diagnosis of anomalies or breakdowns in the control system (S) and to provide serial-type electrical auto-diagnosis signals at an output (5), the signals containing information on the operating conditions of the control system (S). The various control systems (S) each have the same standard electrical connector (6) connected to the output (5) of the respective control unit (1). Each time it is actuated, the electronic control unit (1) of each system (S) outputs at the output (5) a serial-coded identification message of the type of control system (S) to which the unit (1) belongs. The system includes test apparatus (a tester) (7) provided with an electrical connector (27) which can be coupled to the standard connector (6). The tester (7) includes a visual display device (9) and a control keyboard (10) connected to a microprocessor control unit (23) provided with memory devices (12) in which a plurality of diagnosis programmes are held, each of which relates to a corresponding type of control system (S). The microprocessor unit (23) of the tester (7) is arranged to decode the identification message emitted by the control units (1) of the various systems (S) and to render operative the diagnosis programme corresponding to the type of system (S) indicated in the identification message at that moment.

4 Claims, 3 Drawing Sheets

SYSTEM FOR DIAGNOSING ANOMALIES OR BREAKDOWNS IN A PLURALITY OF TYPES OF ELECTRONIC CONTROL SYSTEMS INSTALLED IN MOTOR VEHICLES

BACKGROUND OF THE INVENTION

The present invention relates to a system for diagnosing anomalies or breakdowns in a plurality of types of electronic control systems installed in motor vehicles with internal combustion engines, each type of control system including a respective plurality of sensors for sensing the operating conditions of the engine and electrically-controlled actuator means connected to an electronic control and operating unit, which is usually different for each type of control system, the unit having at least one output and being programmed to carry out the auto-diagnosis of anomalies or breakdowns in the control system and to provide at the output serial electrical auto-diagnosis signals containing information on the operating conditions of the control system.

In modern motor vehicles there are ever more applications of complex electronic control systems for controlling various pieces of apparatus and functions, such as, for example, the ignition, the fuel injection, brake control, air conditioning, etc. According to the function or apparatus controlled, these systems have different characteristics. In general, however, their structure includes an electronic control unit (controller), a plurality of sensors, and a plurality of actuators and related wiring for their connection to the control unit.

The adoption of electronic control systems has enabled the performance and comfort offered by motor vehicles to be improved substantially. The application of such systems, or at least many of them, is ever more widespread, not only in more expensive and prestigious cars but also in average and cheaper cars.

The adoption of electronic control systems in vehicles has created problems in the diagnosis, that is, recognition, of breakdowns and anomalies in operation, in order to enable rapid replacement or repair of the defective or broken components. These problems arise both during operational testing of motor vehicles by the manufacturers and in after-sales service centres.

These problems are complicated and not easy to solve in view of the fact that the electronic control systems used in the various motor vehicle models produced differ even in those from the same manufacturer. Moreover, service centres are traditionally more prepared to face and solve problems of a mechanical nature than electronic problems.

In any case, in order to identify defects or breakdowns in electronic systems with a certain degree of rapidity, a very profound knowledge of such systems is needed by the personnel carrying out the diagnosis.

In order to facilitate diagnosis of such problems, specific pieces of apparatus have been developed, each of which is dedicated exclusively to the identification (diagnosis) of the defects or breakdowns in a particular electronics system. Such apparatus is generally very expensive and also requires adequate preparation on the part of the personnel to enable them to use it correctly.

In the current situation, after-sales service centres must have highly specialised personnel with a deep knowledge of all electronic systems installed in vehicles they expect to service. Moreover, it is also necessary for these centres to have all the specific test apparatus available for diagnosing breakdowns of these systems.

The problem is thus felt particularly with regard to so-called "intermittent faults", that is, those failures which occur only under particular conditions of use of the vehicle and which cease to manifest themselves when the latter is stationary in a service centre.

SUMMARY OF THE INVENTION

The object of the present invention is to provide a system which enables anomalies or breakdowns to be diagnosed simply and quickly in a plurality of different types of electronic control systems in motor vehicles.

This object is achieved according to the invention by means of a system of the type specified above, the main characteristic of which lies in the fact that:

the different control systems installed in the motor vehicles are each provided with a standard electrical connector connected to the output of the respective electronic control unit;

the electronic unit of each system is arranged to output at the output a serial-coded identification message of the type of control system to which the unit belongs, each time it is activated;

the system further includes test apparatus (a tester) having an electrical connector which can be coupled to the standard connector and including a visual display device and an operating keyboard connected to a microprocessor control unit having memory means in which a plurality of diagnosis programmes are held, each of which relates to a corresponding type of control system, the microprocessor unit being arranged to decode the identification messages output by the different control units and to render operative the diagnosis programme corresponding to the type of system indicated in the identification message.

BRIEF DESCRIPTION OF THE DRAWINGS

Further characteristics and advantages of the system of the invention will become apparent from the detailed description which follows with reference to the appended drawings, provided purely by way of non-limiting example, in which.

DETAILED DESCRIPTION OF THE INVENTION

Figure 1:
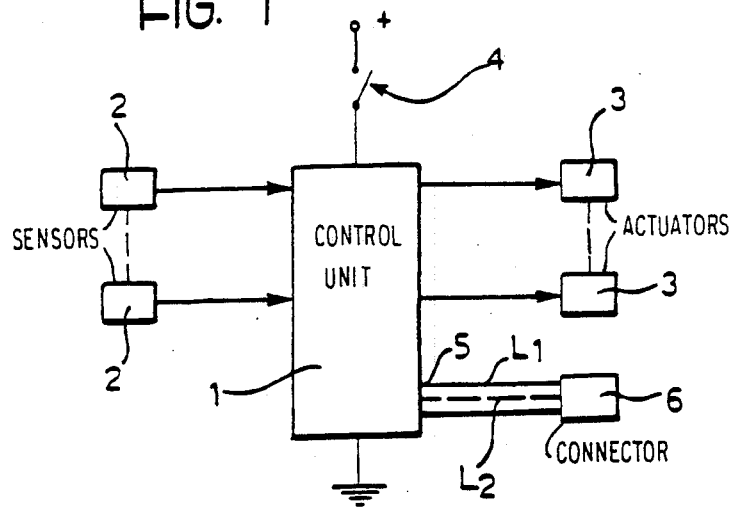
FIG. 1 is a block diagram showing the general structure of an electronic control system installed in a motor vehicle.

FIG. 1 shows the general block-schematic structure of an electronic control system S installed in a motor vehicle, for example, a system for controlling the ignition, the fuel injection, or the like. In general, an electronic control system S of this type includes an electronic control unit 1, formed, for example, with the use of a microprocessor, to which there are connected a plurality of sensors 2 which output electrical signals indicative of the values assumed by respective magnitudes or parameters monitored. For example, the sensors may be temperature sensors, engine revolution sensors, etc. The control unit 1 is also connected to electrically-controlled actuators 3 such as, for example, on-off solenoid valves, etc.

The electronic control unit 1 is supplied with current from the battery of the motor vehicle after closure of an activating switch 4 operable, for example, by the ignition and starter switch.

The control unit 1 is programmed to diagnose anomalies or breakdowns in the control system S. This is achieved in known manner through a suitable programme of the microprocessor of the unit. The high processing speed afforded by microprocessors allows not only the specific functional testing of the system S but also the implementation of controls and checks of the range of signals given by these sensors, to support the diagnosis of any malfunctions or breakdowns during the testing and/or the repair phase.

The microprocessor of the electronic control unit, suitably programmed, may compare, for example, the signals from the sensors 2 with predetermined stored values of acceptable limits, may check the operation of the memories and partly that of its own arithmetic-logic unit, the logical consistency of the signals from the sensors, and the operation of the actuators, for example, by evaluating their operational efficiency on the basis of information coming from the sensors.

In the diagnosis system of the invention, the electronic control systems installed in the motor vehicles, whatever their type or whatever function or groups of functions they are intended to control, have their respective electronic control units 1 arranged to carry out auto-diagnosis programmes in the manner explained above and to transmit to the exterior (at an output indicated 5 in FIG. 1) electrical serial signals containing a coded message for identifying the type of control system S to which the unit 1 belongs and information on the operating conditions of the control system S, such as the values detected by the sensors, the condition or state of the actuators, and information relating to the internal operative state of the unit 1.

Figure 2:
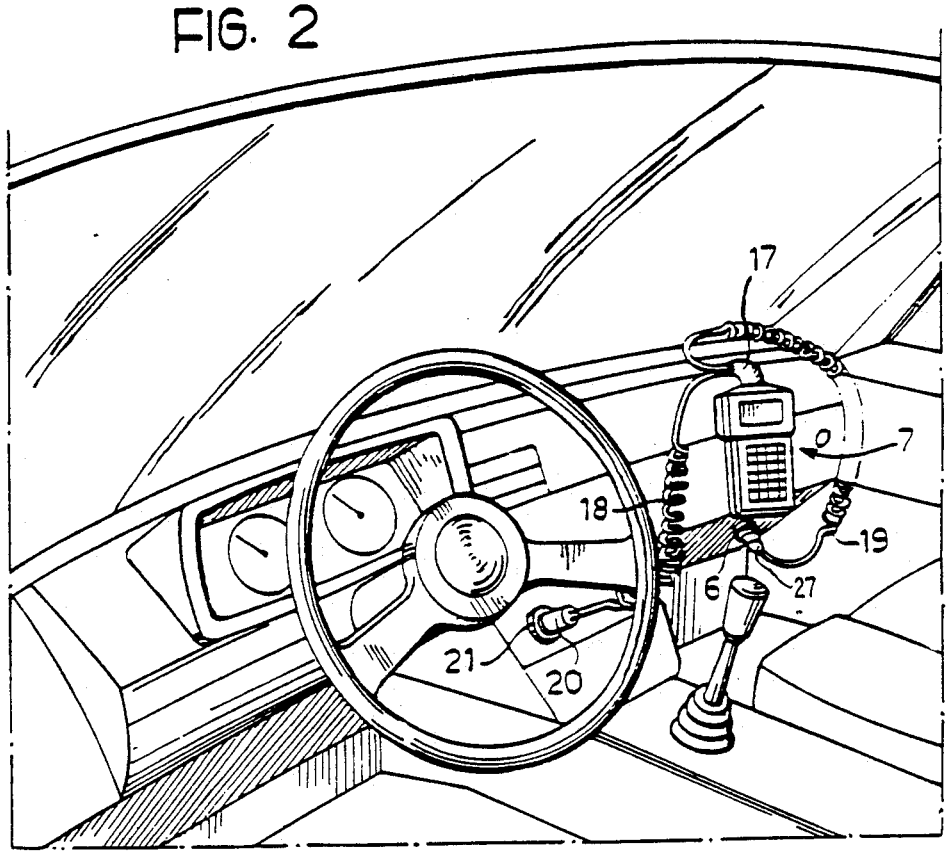
FIG. 2 is a partial perspective view of the passenger compartment of a motor vehicle with a diagnosis system according to the present invention.

The output 5 of the control unit 1 of a generic control system is connected to a standard electrical connector 6, that is, one having the same characteristics for all the control systems. The connector 6 is mounted in an easily accessible position, for example, on the dashboard of the motor vehicle, as illustrated in FIG. 2.

Figure 3:
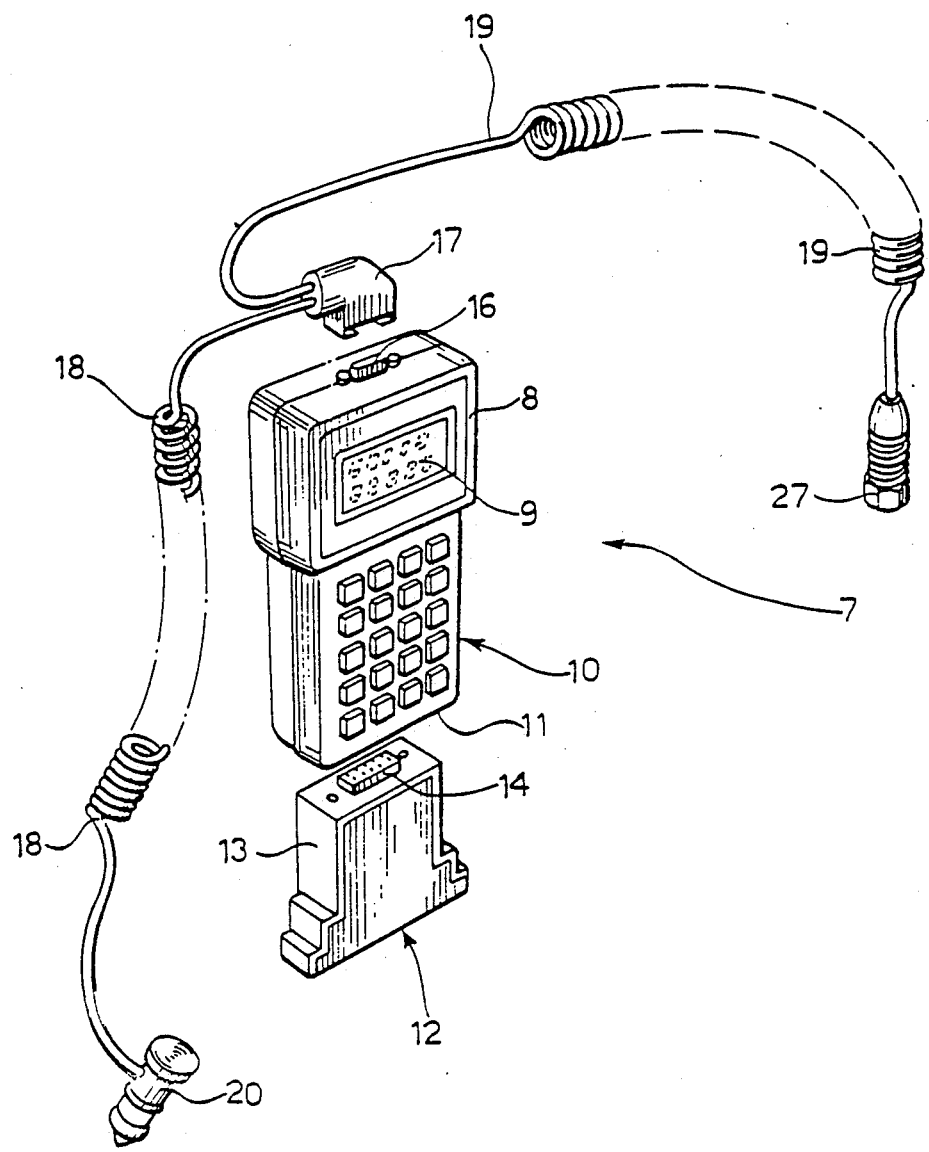
FIG. 3 shows a tester for use in the diagnosis system of the invention.

The diagnosis system of the invention envisages the use of a single piece of test apparatus or tester for diagnosing the anomalous operation or breakdown of a plurality of types of control systems S. This apparatus or tester is generally indicated 7 in FIG. 2 and is best seen in FIG. 3.

In the embodiment illustrated, the tester 7 includes a substantially parallelepipedal casing 8, a visualizer or display 9 which may, for example, be of the liquid crystal type with four rows of 16 characters, and an operating keyboard 10.

At one end the casing 8 of the tester 7 has an aperture 11 (FIG. 3) for allowing the insertion and removal of a module 12. This module comprises a body 13 in which are mounted integrated electronic memory devices, for example, of the EPROM type. These memory devices are connected to the circuitry within the tester 7 through a multipolar connector 14 carried by the upper part of the module and intended to be coupled with a corresponding multipolar connector mounted within the body 8 of the tester. This further multipolar connector, not visible in FIG. 3, is indicated 15 in FIG. 4.

The tester 7 also includes a multipolar connector 16 fixed to one end of the body 8 and connected to the circuitry within the tester itself. This connector can be coupled to a connector 17 from which there branch two multipolar cables 18 and 19 for the electrical supply and the transmission of signals, respectively. The supply cable 18 is intended for connection, in use, to the battery of the motor vehicle, for example, through a plug 20 insertible in the cigar lighter socket 21 (FIG. 2) with which the motor vehicle may be provided.

Naturally, the tester 7 could be provided with internal supply batteries so as to render the connection to the motor vehicle battery superfluous.

The cable 19 has an end connector 27 for coupling to the standard connector 6.

Figure 4:
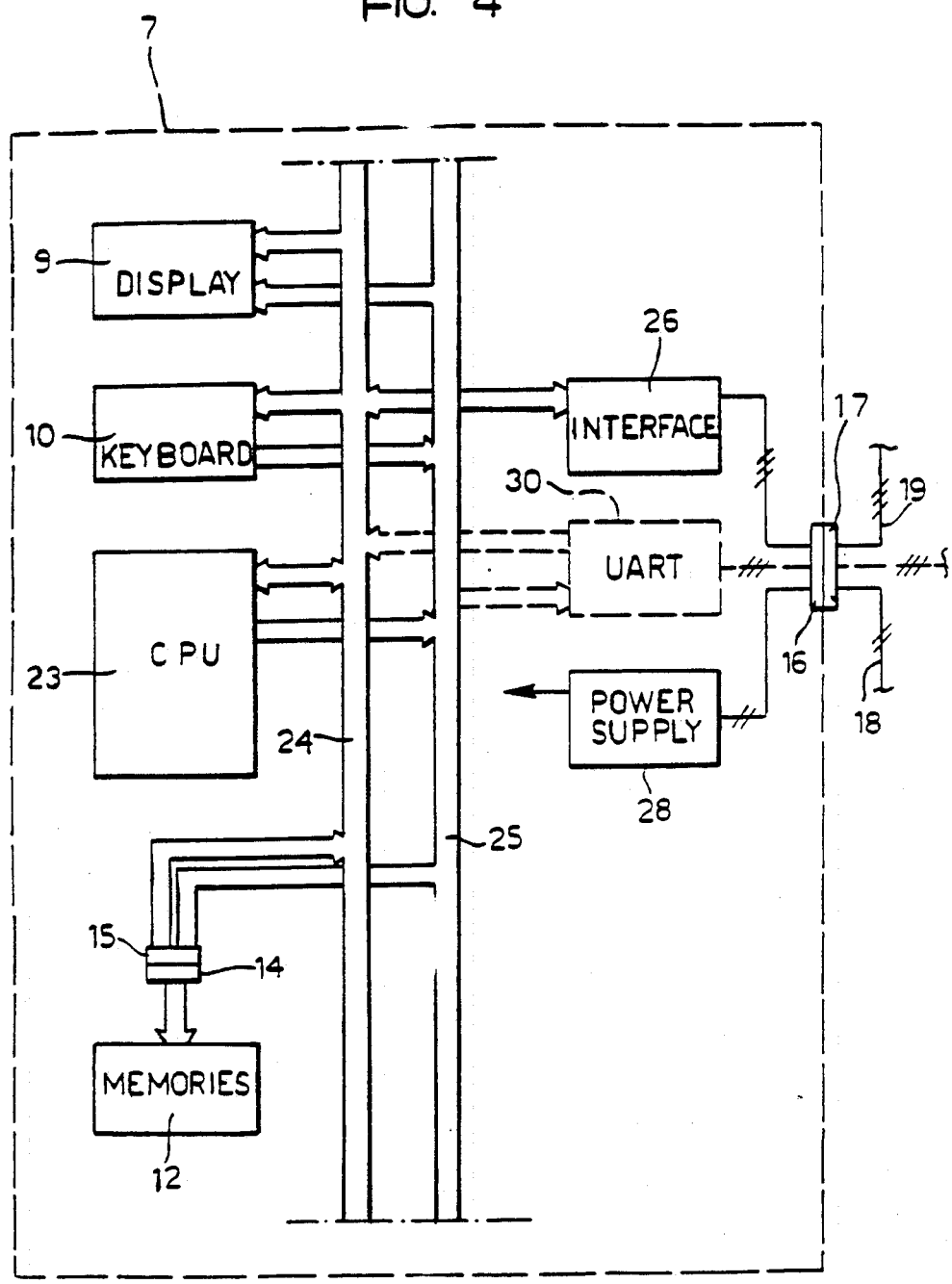
FIG. 4 is a block diagram showing the circuit structure of the tester of FIG. 3.

As shown in FIG. 4, the circuitry within the tester 7 includes a central microprocessor unit 23 connected to a data bus 24 and a address bus 25. These buses 24 and 25 are also connected to the display 9, the keyboard 10, the memory devices of the module 12, and an interface circuit 26. The latter is intended for connection to the control unit 1 of a system S, any operational anomalies of which it is wished to diagnose, through the connectors 16 and 17, the multipolar cable 19 and the standard connector 6.

In the embodiment illustrated, the tester 7 also includes a stabilised supply 28 having its input connected to the connector 16.

The memory devices of the module 12 of the tester store a plurality of programmes or diagnosis procedures, each of which relates to a corresponding type of control system S.

As stated above, the control unit 1 of the different control systems S is arranged to generate and output at the output 5 connected to the standard connector 6 a serial-coded message for identifying the type of control system to which the unit belongs, each time the unit 1 is activated by closure of the supply switch 4.

In use, the tester 7 is coupled through the cables 18 and 19 to the vehicle battery and to the control unit 1 of the electronic control system S, any operational anomalies or breakdowns of which it is wished to diagnose. The control unit 1 being tested is then activated, for example, by the turning of the key in the ignition and starting switch from the stop position to the running position. The control unit 1 outputs at the output 5 the appropriate serial-coded identification message which is fed through the signal cable 19 to the processing and control circuitry of the tester 7. The central microprocessor unit 23 identifies the type of control system and selects the diagnosis programmes relating to this type of control system in the memory devices of the module 12.

In the simplest case, a control system S may include an electronic control unit 1 arranged simply to repeat cyclically at its output serial information signals relating to the readings of the sensors and the states of the actuators without any arrangement for interactive exchange of information with the tester 7. For this type of control system, the tester is programmed so that its microprocessor unit 23 can synchronise with the signals output by the control unit 1 of the system S under examination and acquire and decode the information output by this unit.

In other types of control systems installed in motor vehicles, the electronic unit 1 may be made so that it can check two lines of signals, input and output respectively. In FIG. 1, these lines are indicated $L_1$ and $L_2$.

This type of control unit may conveniently be programmed to achieve an interactive exchange of information with the tester 7. The latter may be arranged to allow interrogation of the unit 1 of the control system under examination and to send this unit control signals to start particular modes of operation, for example, the separate activation of one or more actuators of the system in a predetermined manner to allow its checking by the repairer.

Further types of control systems, however, may include electronic units 1 able to pilot a two-way signal line. Again in this case, it is possible to achieve an interactive exchange of information between the control system S under examination and the tester, and it is possible to send commands to the control unit 1 of the system under examination via the tester.

As already stated, the type of system S with which the tester is connected at any time is identified by a serial-coded identification message emitted automatically by the control unit of the control systems S made in accordance with the present invention each time it is activated. The code used for this identification signal may, for example, be the NRZ code (non-return tO zero), that is, the method of binary representation characterised by no change in the levels of the signal when two successive bits are transmitted at the same logic level.

Conveniently, the tester 7 is equipped with a suitable series of components-samples (not illustrated), for example, sample resistors, intended to "simulate" sensors of a control system S under examination, the efficiency of which it is wished to check. Thus, for example, in order to check the efficiency of a temperature sensor constituted by a thermo-resistance, the tester 7 may be equipped with a sample resistor intended to be substituted physically for the temperature sensor. The value of the resistance of this resistor read by the control unit 1 of the system under examination is compared with a predetermined stored value.

By virtue of the use of components-samples, the tester enables, by successive exclusions, the determination of whether anomalous operation can be imputed to a breakdown in a sensor or an actuator or to a break in the cable or breakdown of the control unit 1.

The tester 7 may be updated to allow the diagnosis of malfunctions or breakdowns of new types of control systems: for this purpose, it suffices to replace the memory module 12 by a new module in which diagnosis programmes including those of new types of control systems have been memorised.

In known manner, the microprocessor unit 23 of the tester may be programmed to display the indication of the values read by the sensors or of the states of the actuators and the indication of any subsequent operation suggested to the user on the display 9 during the diagnosis procedure. The display 9 also enables written results of the diagnosis effected to be displayed.

Naturally, the programmes for the tester 7 may be arranged so that all the written results appearing on the display 9 are in a language selected (for example, by operation of a key of the keyboard) from a predetermined group of languages.

Conveniently, the tester 7 may be programmed to display upon request, at any stage of a diagnosis procedure, information useful for a better understanding of the operations to be carried out in order to identify the breakdown. For this purpose, a suitable key (help key) of the keyboard may be provided.

The diagnosis programmes may be arranged to display instructions urging the operator to repeat the diagnosis procedure once the repair has been carried out, as a further check that the system tested is effectively in order.

The diagnosis system according to the invention has numerous advantages.

In the first place, it enables the diagnosis of breakdowns of a plurality of types of electronic control systems in vehicles to be carried out with the use of a single piece of test apparatus or tester.

The instrumentation needed in service stations is thus greatly simplified.

The diagnosis of malfunctions in on-board electronic systems is very much simplified by the guided diagnosis procedures memorised in the tester.

Moreover, the tester is even able to diagnose breakdowns in systems when the motor vehicle is moving, whereby it enables the problem of diagnosing "intermittent" faults to be solved.

Conveniently, the circuitry within the tester 7 may be provided with a universal asynchronous receiver-transmitter (such as that indicated 30 in FIG. 4) connected to the buses 24 and 25 and to an external printer or personal computer.

We claim:

1. System for diagnosing anomalies or breakdowns in a plurality of types of electronic control systems (S) installed in motor vehicles with internal combustion engines, each type of control system (s) including a respective plurality of sensors (2) for sensing the operating conditions of the engine and electrically-controlled actuator means (3) connected to an electronic control and operating unit (1), which is usually different for each type of control system (S), the unit (1) having at least one output (5) and being programmed to carry out the auto-diagnosis of anomalies or breakdowns in the control system (S) and to provide at the output (5) serial electrical auto-diagnosis signals containing information on the operating conditions of the control system (S), characterised in that:

the different control systems (S) are each provided with an identical standard electrical connector (6) connected to the output (5) of the respective control unit (1), the electronic unit (1) of each system is arranged to output at the output (5) a serial-coded identification message of the type of control system (S) to which the unit (1) belongs, each time it (1) is activated;

the system further includes test apparatus or a tester (7) having an electrical connector (27) which can be coupled to the standard connector (6) and including a visual display device (9) and an operating keyboard (10) connected to a microprocessor control unit (23) having memory means (12) in which a plurality of diagnosis programmes are held, each of which relates to a corresponding type of control system (S), the microprocessor unit (23) being arranged to decode the identification messages output by the different control units (1) and to render operative the diagnosis programme corresponding to the type of system (S) indicated in the identification message at that moment, wherein the electronic unit (1) in each control system (S) is arranged to generate a serial identification message with the NRZ (non-return to zero) code.

2. System according to claim 1, characterised in that the memory means of the test apparatus (7) are mounted in a replaceable module (12) which can be separated from the test apparatus (7).

3. System according to claim 1 particularly for use in motor vehicles having electric cigar lighters supplied by the battery of the vehicle through a socket (21), characterised in that the test apparatus (7) has means (18, 20) for enabling its electrical supply through the socket (21).

4. System according to claim 1 characterised in that the test apparatus (7) has at least one supply battery.

* * * * *